(12) United States Patent
Matsui et al.

(10) Patent No.: US 10,113,035 B2
(45) Date of Patent: Oct. 30, 2018

(54) CURABLE POLYSILSESQUIOXANE COMPOUND, PRODUCTION METHOD THEREFOR, CURABLE COMPOSITION, CURED PRODUCT AND USE METHOD OF CURABLE COMPOSITION

(71) Applicant: LINTEC CORPORATION, Tokyo (JP)

(72) Inventors: Masami Matsui, Tokyo (JP); Mikihiro Kashio, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 15/309,145

(22) PCT Filed: May 7, 2015

(86) PCT No.: PCT/JP2015/063218
§ 371 (c)(1),
(2) Date: Nov. 4, 2016

(87) PCT Pub. No.: WO2015/170710
PCT Pub. Date: Nov. 12, 2015

(65) Prior Publication Data
US 2017/0058083 A1    Mar. 2, 2017

(30) Foreign Application Priority Data

May 7, 2014    (JP) .................................. 2014-096256

(51) Int. Cl.
| | | |
|---|---|---|
| *C08G 77/14* | (2006.01) |
| *C08G 77/16* | (2006.01) |
| *C09J 183/06* | (2006.01) |
| *C08K 5/54* | (2006.01) |
| *C08G 77/08* | (2006.01) |
| *C08L 83/04* | (2006.01) |
| *H01L 23/29* | (2006.01) |
| *H01L 23/31* | (2006.01) |
| *H01L 21/52* | (2006.01) |
| *H01L 33/56* | (2010.01) |
| *C08G 77/06* | (2006.01) |
| *C08K 5/5435* | (2006.01) |
| *C08K 5/5455* | (2006.01) |

(52) U.S. Cl.
CPC ............ *C08G 77/14* (2013.01); *C08G 77/06* (2013.01); *C08G 77/08* (2013.01); *C08G 77/16* (2013.01); *C08K 5/54* (2013.01); *C08K 5/5435* (2013.01); *C08K 5/5455* (2013.01); *C08L 83/04* (2013.01); *C09J 183/06* (2013.01); *H01L 21/52* (2013.01); *H01L 23/29* (2013.01); *H01L 23/296* (2013.01); *H01L 23/31* (2013.01); *H01L 33/56* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 4,741,778 A | * | 5/1988 | Horie | ................... C09D 183/02 |
| | | | | 106/287.16 |
| 7,727,635 B2 | * | 6/2010 | Furuya | ..................... C08L 83/04 |
| | | | | 428/331 |
| 2002/0082338 A1 | | 6/2002 | Furuya et al. | |
| 2007/0099009 A1 | * | 5/2007 | Shimizu | ................... C08J 7/047 |
| | | | | 428/447 |
| 2009/0008673 A1 | | 1/2009 | Kato et al. | |
| 2009/0169790 A1 | * | 7/2009 | Nadeau | ............... B29C 47/0023 |
| | | | | 428/36.91 |
| 2011/0034659 A1 | | 2/2011 | Kashio et al. | |

(Continued)

FOREIGN PATENT DOCUMENTS

| | | |
|---|---|---|
| JP | 2004-359933 A | 12/2004 |
| JP | 2005-263869 A | 9/2005 |

(Continued)

OTHER PUBLICATIONS

"Synthetic Control of Molecular Weight and Microstructure of Processible Poly(methylsilsesquioxane)s for Low-dielectric Thin Film Applications" authored by Lee et al. and published in Polymer (2001) 42, 9085-9089.*

(Continued)

*Primary Examiner* — Marc S Zimmer
(74) *Attorney, Agent, or Firm* — Birch, Stewart, Kolasch & Birch, LLP (57) ABSTRACT

The present invention is a curable polysilsesquioxane compound comprising one structural unit or two or more structural units represented by $R^1SiO_{3/2}$, the curable polysilsesquioxane compound having a $^{29}Si$ nuclear magnetic resonance spectrum that has a first peak top within a range of −60 ppm or more and less than −54 ppm, has a second peak top within a range of −70 ppm or more and less than −61 ppm, and substantially does not have a peak within a range of −53 ppm or more and less than −45 ppm, and a method for producing the curable polysilsesquioxane compound, and a curable composition comprising the curable polysilsesquioxane compound and a silane coupling agent, and a cured product obtained by heating the curable composition, and a method for using the curable polysilsesquioxane compound or the curable composition, as an optical device-securing material.

14 Claims, 1 Drawing Sheet

(56) References Cited

U.S. PATENT DOCUMENTS

| | | | |
|---|---|---|---|
| 2011/0065881 A1* | 3/2011 | Iji | C07F 7/0852 |
| | | | 528/10 |
| 2013/0035455 A1 | 2/2013 | Kashio | |
| 2013/0075154 A1* | 3/2013 | Saito | C08L 83/04 |
| | | | 174/536 |
| 2015/0065663 A1 | 3/2015 | Matsui et al. | |
| 2015/0299396 A1 | 10/2015 | Matsui et al. | |

FOREIGN PATENT DOCUMENTS

| | | | |
|---|---|---|---|
| JP | 2006-328231 A | | 12/2006 |
| JP | 2007-70600 A | | 3/2007 |
| JP | 2007-112975 A | | 5/2007 |
| JP | 2007-169375 A | * | 7/2007 |
| JP | 2008-179811 A | | 8/2008 |
| JP | 2012-197425 A | | 10/2012 |
| JP | 5550162 B1 | | 7/2014 |
| JP | 5940456 B2 | | 6/2016 |
| WO | WO 2011/111673 A1 | | 9/2011 |
| WO | WO 2012/073988 A1 | | 6/2012 |
| WO | WO 2013/141360 A1 | | 9/2013 |
| WO | WO 2014/069508 A1 | | 5/2014 |

OTHER PUBLICATIONS

Machine translation for JP 2007-169375 (no date).*
International Search Report for PCT/JP2015/063218 (PCT/ISA/210) dated Jun. 16, 2015.
Written Opinion of the International Searching Authority for PCT/JP2015/063218 (PCT/ISA/237) dated Jun. 16, 2015.
English Translation of the Written Opinion of the International Searching Authority (Form PCT/ISA/237), dated Jun. 16, 2015, for International Application No. PCT/JP2015/063218.
Database WPI week 200729, Clarivate Analytics, Thomson Scientific, London, GB; AN 2007-297504, XP002775854, 2007, 1 page.
Extended European Search Report dated Dec. 4, 2017, for European Application No. 15789000.5.

* cited by examiner

FIG 1

FIG 2

CURABLE POLYSILSESQUIOXANE COMPOUND, PRODUCTION METHOD THEREFOR, CURABLE COMPOSITION, CURED PRODUCT AND USE METHOD OF CURABLE COMPOSITION

TECHNICAL FIELD

The present invention relates to a curable polysilsesquioxane compound that produces a cured product that exhibits high adhesion, excellent heat resistance, and excellent delamination resistance, and rarely produces cracks, a method for producing the same, a curable composition, a cured product obtained by curing the curable composition, and a method for using the curable polysilsesquioxane compound or the curable composition as an optical device-securing material.

BACKGROUND ART

A light-emitting device (e.g., laser (e.g., semiconductor laser diode (LD)) and light-emitting diode (LED)), a light-receiving device, a hybrid optical device, an optical integrated circuit, and the like are known as an optical device.

In recent years, an optical device that emits blue light or white light (i.e., an optical device having a shorter emission peak wavelength) has been developed, and widely used. There is a tendency that the brightness of a light-emitting device having a short emission peak wavelength is significantly increased, and the amount of heat generated by such an optical device further increases.

A curable composition (optical device-securing material composition) has been used as an adhesive and a sealing material for such an optical device.

Along with a recent increase in brightness of an optical device, however, a cured product of the optical device-securing composition may deteriorate due to long-term exposure to high-energy light or high-temperature heat generated by the optical device, whereby delamination or cracks may occur, for example.

In order to solve this problem, Patent Literature 1 to 3 propose an optical device-securing material composition that includes a polysilsesquioxane compound as the main component.

A polysilsesquioxane compound is a compound represented by $(RSiO_{3/2})_n$ (wherein R is a substituted or unsubstituted alkyl group, a substituted or unsubstituted aryl group, or the like), and has intermediate properties between inorganic silica ($SiO_2$) and an organic silicone ($(R_2SiO)_n$).

However, the optical device-securing compositions disclosed in Patent Literature 1 to 3 that include a polysilsesquioxane compound as the main component may not produce a cured product that exhibits sufficient heat resistance and delamination resistance while maintaining sufficient adhesion.

Therefore, development of a curable composition that can produce a cured product that exhibits high adhesion, excellent heat resistance, and excellent delamination resistance, and rarely produces cracks has been desired.

Patent Literature 4 discloses a semiconductor light-emitting device member that has a solid Si-nuclear magnetic resonance spectrum that has at least one peak selected from the group consisting of a peak whose peak top position is within the chemical shift range of −40 ppm or more and 0 ppm or less, and whose full width at half maximum is within a specific range, and a peak whose peak top position is within the chemical shift range of −80 ppm or more and less than −40 ppm, and whose full width at half maximum is within a specific range, has a silicon content of 20 wt % or more, and has a silanol content of 0.1 to 10 wt %.

CITATION LIST

Patent Literature

Patent Literature 1: JP-A-2004-359933
Patent Literature 2: JP-A-2005-263869
Patent Literature 3: JP-A-2006-328231
Patent Literature 4: JP-A-2007-112975 (US2009/0008673A1)

SUMMARY OF INVENTION

Technical Problem

The invention was conceived in view of the above situation. An object of the invention is to provide a curable compound and a curable composition that can produce a cured product that exhibits high adhesion, excellent heat resistance, and excellent delamination resistance, and rarely produces cracks, a method for producing the curable compound, a cured product obtained by curing the curable composition, and a method for using the curable compound or the curable composition.

Solution to Problem

The inventors conducted extensive studies in order to solve the above technical problem. As a result, the inventors found that a curable polysilsesquioxane compound that includes one structural unit or two or more structural units represented by $R^1SiO_{3/2}$ (wherein $R^1$ is an alkyl group having 1 to 10 carbon atoms), and has a $^{29}Si$ nuclear magnetic resonance spectrum that has a first peak top within the range of −60 ppm or more and less than −54 ppm, has a second peak top within the range of −70 ppm or more and less than −61 ppm, and substantially does not have a peak within the range of −53 ppm or more and less than −45 ppm, can produce a cured product that exhibits high adhesion, excellent heat resistance, and excellent delamination resistance, and rarely produces cracks. This finding has led to the completion of the invention.

Several aspects of the invention provide the following curable polysilsesquioxane compound (see (1) to (3)), method for producing a curable polysilsesquioxane compound (see (4) to (6)), curable composition (see (7)), cured product (see (8)), and method for using a curable polysilsesquioxane compound or a curable composition as an optical device-securing material (see (9)).

(1) A curable polysilsesquioxane compound including one structural unit or two or more structural units represented by $R^1SiO_{3/2}$ (wherein $R^1$ is an alkyl group having 1 to 10 carbon atoms), the curable polysilsesquioxane compound having a $^{29}Si$ nuclear magnetic resonance spectrum that has a first peak top within the range of −60 ppm or more and less than −54 ppm, has a second peak top within the range of −70 ppm or more and less than −61 ppm, and substantially does not have a peak within the range of −53 ppm or more and less than −45 ppm.

(2) The curable polysilsesquioxane compound according to (1), the curable polysilsesquioxane compound having the $^{29}Si$ nuclear magnetic resonance spectrum in which the ratio of an integral value (P2) of a peak within the range of −70 ppm or more and less than −61 ppm to an integral value (P1) of a peak within the range of −60 ppm or more and less than −54 ppm is 60 to 90%.

(3) The curable polysilsesquioxane compound according to (1), the curable polysilsesquioxane compound being a compound having a mass average molecular weight of 1,000 to 50,000.

(4) A method for producing the curable polysilsesquioxane compound according to (1), the method including a step (I) that subjects one compound or two or more compounds represented by the following formula (1) to polycondensation in the presence of a polycondensation catalyst, $$R^1Si(OR^2)_3 \quad (1)$$

wherein $R^1$ is an alkyl group having 1 to 10 carbon atoms, and $R^2$ is a hydrogen atom or an alkyl group having 1 to 10 carbon atoms, provided that a plurality of $R^2$ are either identical to or different from each other.

(5) The method according to (4), wherein the polycondensation catalyst is at least one acid catalyst selected from the group consisting of hydrochloric acid, boric acid, citric acid, acetic acid, sulfuric acid, and methanesulfonic acid.

(6) The method according to (5), further including a step (II) that adds an organic solvent to the reaction mixture obtained by the step (I) to dissolve the polycondensate of the compound represented by the formula (1) to obtain a solution, adds a base to the solution in a molar equivalent equal to or larger than that of the acid catalyst, and then effects polycondensation.

(7) A curable composition including the curable polysilsesquioxane compound according to (1), and a silane coupling agent.

(8) A cured product obtained by heating the curable composition according to (7).

(9) A method for using the curable polysilsesquioxane compound according to (1), or the curable composition according to (7), as an optical device-securing material.

Advantageous Effects of Invention

The curable polysilsesquioxane compound according to the invention, and the curable composition according to the invention that includes at least the curable polysilsesquioxane compound according to the invention and a silane coupling agent, can produce a cured product that exhibits high adhesion, excellent heat resistance, and excellent delamination resistance, and rarely produces cracks.

The method for producing a curable polysilsesquioxane compound according to the invention can efficiently produce the curable polysilsesquioxane compound according to the invention.

The cured product according to the invention exhibits high adhesion even when exposed to high-energy light, or subjected to a high temperature, and can sufficiently seal an optical device for a long time.

The curable polysilsesquioxane compound according to the invention and the curable composition according to the invention may be used as an optical device-securing material. In particular, the curable polysilsesquioxane compound according to the invention and the curable composition according to the invention may suitably be used as an optical device adhesive and an optical device sealing material.

DESCRIPTION OF EMBODIMENTS

A curable polysilsesquioxane compound, a method for producing a curable polysilsesquioxane compound, a curable composition, a cured product, and a method for using the curable polysilsesquioxane compound or the curable composition as an optical device-securing material according to the exemplary embodiments of the invention are described in detail below.

1) Curable Polysilsesquioxane Compound

A curable polysilsesquioxane compound according to one embodiment of the invention includes one structural unit or two or more structural units represented by $R^1SiO_{3/2}$, the curable polysilsesquioxane compound having a $^{29}$Si nuclear magnetic resonance spectrum that has a first peak top within the range of −60 ppm or more and less than −54 ppm, has a second peak top within the range of −70 ppm or more and less than −61 ppm, and substantially does not have a peak within the range of −53 ppm or more and less than −45 ppm.

Note that the expression "curable" used herein means that curing can be effected using heat in an arbitrary manner.

$R^1$ included in the formula "$R^1SiO_{3/2}$" is an alkyl group having 1 to 10 carbon atoms.

Examples of the alkyl group having 1 to 10 carbon atoms include a methyl group, an ethyl group, an n-propyl group, an isopropyl group, an n-butyl group, a t-butyl group, an isobutyl group, an s-butyl group, an n-pentyl group, an n-hexyl group, an n-octyl group, an n-decyl group, and the like.

It is preferable that $R^1$ be an alkyl group having 1 to 6 carbon atoms from the viewpoint of easily obtaining the advantageous effects of the invention, and improving economic efficiency.

A polysilsesquioxane compound is a silicon-based polymer that is obtained by subjecting a trifunctional organosilane compound to polycondensation, and exhibits inorganic properties due to the siloxane bond (Si—O—Si) included in the main chain, and organic properties due to the organic group ($R^1$) included in the side chain.

The structure of the curable polysilsesquioxane compound according to one embodiment of the invention is not particularly limited. For example, the curable polysilsesquioxane compound according to one embodiment of the invention may have a ladder structure, a double decker structure, a basket structure, a partially cleaved basket structure, a cyclic structure, or a random structure.

The curable polysilsesquioxane compound according to one embodiment of the invention is a polymer that includes one structural unit or two or more structural units represented by $R^1SiO_{3/2}$ (wherein $R^1$ is the same as defined above (hereinafter the same)). When the curable polysilsesquioxane compound according to one embodiment of the invention is a copolymer that includes two or more structural units represented by $R^1SiO_{3/2}$, the curable polysilsesquioxane compound according to one embodiment of the invention may be a random copolymer or a block copolymer, but is preferably a random copolymer from the viewpoint of availability and the like.

The structural unit represented by $R^1SiO_{3/2}$ included in the curable polysilsesquioxane compound according to one embodiment of the invention is normally referred to as "T-site", and has a structure in which three oxygen atoms and one group ($R^1$) are bonded to the silicon atom.

Specific examples of the structure of the T-site include structures respectively represented by the following formulas (a) to (c).

Note that $R^2$ is a hydrogen atom or an alkyl group having 1 to 10 carbon atoms. Examples of the alkyl group having 1 to 10 carbon atoms that may be represented by $R^2$ include those mentioned above in connection with $R^1$. Note that a plurality of $R^2$ are either identical to or different from each other. The symbol "*" in the formulas (a) to (c) represents that an Si atom is bonded.

The curable polysilsesquioxane compound according to one embodiment of the invention is soluble in various organic solvents including a ketone-based solvent such as acetone, an aromatic hydrocarbon-based solvent such as benzene, a sulfur-containing solvent such as dimethyl sulfoxide, an ether-based solvent such as tetrahydrofuran, an ester-based solvent such as ethyl acetate, a mixed solvent including two or more solvents among these solvents, and the like.

Therefore, the curable polysilsesquioxane compound according to one embodiment of the invention can be subjected to $^{29}$Si-NMR measurement in a solution state (dissolved state).

When the curable polysilsesquioxane compound according to one embodiment of the invention is subjected to $^{29}$Si-NMR measurement, four peaks T0 to T3 attributed to the T-site are normally observed at −85 to −45 ppm.

It is considered that the peak T0 is attributed to a silicon atom that does not form a siloxane bond, the peak T1 is attributed to a silicon atom that forms one siloxane bond (i.e., the silicon atom included in the structure represented by the formula (c)), the peak T2 is attributed to a silicon atom that forms two siloxane bonds (i.e., the silicon atom included in the structure represented by the formula (b)), and the peak T3 is attributed to a silicon atom that forms three siloxane bonds (i.e., the silicon atom included in the structure represented by the formula (a)).

The curable polysilsesquioxane compound according to one embodiment of the invention has a $^{29}$Si nuclear magnetic resonance spectrum that has the first peak top (corresponding to the peak T2) within the range of −60 ppm or more and less than −54 ppm, has the second peak top (corresponding to the peak T3) within the range of −70 ppm or more and less than −61 ppm, and substantially does not have a peak (corresponding to the peak T1) within the range of −53 ppm or more and less than −45 ppm.

The expression "substantially does not have a peak (corresponding to the peak T1) within the range of −53 ppm or more and less than −45 ppm" means that, when the curable polysilsesquioxane compound according to one embodiment of the invention is subjected to $^{29}$Si-NMR measurement, a peak (corresponding to the peak T1) is not observed within the range of −53 ppm or more and less than −45 ppm, or, even when a peak (corresponding to the peak T1) is observed within the range of −53 ppm or more and less than −45 ppm, the ratio of the integral value of the peak (corresponding to the peak T1) within the range of −53 ppm or more and less than −45 ppm to the integral value of the peak (corresponding to the peak T2) within the range of −60 ppm or more and less than −54 ppm is less than 0.5%.

It is preferable that the ratio of the integral value (P2) of the peak (corresponding to the peak T3) within the range of −70 ppm or more and less than −61 ppm to the integral value (P1) of the peak (corresponding to the peak T2) within the range of −60 ppm or more and less than −54 ppm be 60 to 90%, since the advantageous effects of the invention are further improved.

It is conjectured that the curable polysilsesquioxane compound can produce a cured product that exhibits high adhesion even at a high temperature, exhibits excellent heat resistance and excellent delamination resistance, and rarely produces cracks for the following reasons when the curable polysilsesquioxane compound has a $^{29}$Si-NMR spectrum that substantially does not have a peak top within the range of −53 ppm or more and less than −45 ppm, has the first peak top within the range of −60 ppm or more and less than −54 ppm, and has the second peak top within the range of −70 ppm or more and less than −61 ppm.

Specifically, when the curable polysilsesquioxane compound has a $^{29}$Si-NMR spectrum that has the peak T1, the curable polysilsesquioxane compound has a structure in which a number of components are eliminated due to dehydration or dealcoholization condensation when the curable polysilsesquioxane compound is cured by heating, and voids easily occur due to the eliminated components, whereby a decrease in adhesion occurs. On the other hand, when the curable polysilsesquioxane compound has a $^{29}$Si-NMR spectrum that has the peak T3 in a high ratio, it is considered that the curable polysilsesquioxane compound produces a cured product that has a relatively dense structure, and exhibits sufficient adhesion.

The $^{29}$Si-NMR spectrum may be measured as described below, for example.

Sample Conditions

Dimethyl sulfoxide (DMSO) is used as a measurement solvent, and $Fe(acac)_3$ is used as a relaxation reagent in order to reduce the relaxation time.

The intensity of each peak is normalized using the area of tetramethylsilane (internal standard) (=1) to remove the effects of an error during each measurement.

Device Conditions

A nuclear magnetic resonance spectrometer (e.g., "AV-500" manufactured by Bruker BioSpin K.K.) is used.
$^{29}$Si resonant frequency: 99.352 MHz
Probe: 5 mm (diameter) solution probe
Measurement temperature: 25° C.
Sample rotational speed: 20 kHz
Measurement method: inverse gated decoupling method
$^{29}$Si flip angle: 90°

$^{29}$Si 90° pulse width: 8.0 μs
Repetition time: 5 s
Integration count: 9,200
Observation width: 30 kHz
Waveform Analysis The chemical shift of each peak of the spectrum subjected to a Fourier transform is calculated from the position of the peak top, and integrated.

The mass average molecular weight (Mw) of the curable polysilsesquioxane compound according to one embodiment of the invention is preferably 1,000 to 50,000, and more preferably 5,000 to 40,000.

The mass average molecular weight (Mw) of the curable polysilsesquioxane compound may be determined as a standard polystyrene-equivalent value by gel permeation chromatography (GPC) using tetrahydrofuran (THF) as a solvent, for example.

The molecular weight distribution (Mw/Mn, hereinafter may be referred to as "PDI") of the curable polysilsesquioxane compound according to one embodiment of the invention is not particularly limited, but is normally 1.0 to 6.0. When the molecular weight distribution is within the above range, a cured product that exhibits improved adhesion can be obtained.

The curable polysilsesquioxane compound according to one embodiment of the invention may be produced using an arbitrary method. Note that it is preferable to produce the curable polysilsesquioxane compound according to one embodiment of the invention using a method for producing a curable polysilsesquioxane compound according to one embodiment of the invention (described below).

2) Method for Producing Curable Polysilsesquioxane Compound

The method for producing a curable polysilsesquioxane compound according to one embodiment of the invention includes a step (I) that subjects one compound or two or more compounds represented by the following formula (1) to polycondensation in the presence of a polycondensation catalyst.

$$R^1Si(OR^2)_3 \quad (1)$$

wherein $R^1$ and $R^2$ are the same as defined above, provided that a plurality of $R^2$ are either identical to or different from each other.

Step (I)

In the step (I), the silane compound represented by the formula (1) (hereinafter may be referred to as "silane compound (1)") is subjected to polycondensation in the presence of the polycondensation catalyst.

Specific examples of the silane compound (1) include methyltrimethoxysilane, methyltriethoxysilane, ethyltrimethoxysilane, ethyltriethoxysilane, n-propyltrimethoxysilane, n-butyltriethoxysilane, isobutyltrimethoxysilane, n-pentyltriethoxysilane, n-hexyltrimethoxysilane, isooctyltriethoxysilane, decyltrimethoxysilane, methyldimethoxyethoxysilane, methyldiethoxymethoxysilane, and the like.

These silane compounds may be used either alone or in combination.

The polycondensation catalyst is not particularly limited. Note that it is preferable to use an acid catalyst since the curable polysilsesquioxane compound according to one embodiment of the invention can be easily obtained. Examples of the acid catalyst include an inorganic acid such as hydrochloric acid, sulfuric acid, nitric acid, phosphoric acid, and boric acid; an organic acid such as methanesulfonic acid, trifluoromethanesulfonic acid, benzenesulfonic acid, p-toluenesulfonic acid, acetic acid, trifluoroacetic acid, and citric acid; and the like.

It is preferable to use at least one acid catalyst selected from the group consisting of hydrochloric acid, boric acid, citric acid, acetic acid, sulfuric acid, and methanesulfonic acid, and particularly preferably hydrochloric acid, since the target product can be easily obtained.

The polycondensation catalyst is used in an appropriate amount (ratio) taking account of the type of the silane compound (1), the type of the polycondensation catalyst, and the like. The polycondensation catalyst is normally used in a ratio of 0.05 to 30 mol %, preferably 0.1 to 10 mol %, and more preferably 0.2 to 5 mol %, based on the total number of moles of the silane compound (1).

A solvent may be appropriately selected taking account of the type and the amount of the silane compound (1), the type and the amount of the polycondensation catalyst, and the like. Examples of the solvent include water; aromatic hydrocarbons such as benzene, toluene, and xylene; esters such as methyl acetate, ethyl acetate, propyl acetate, and methyl propionate; ketones such as acetone, methyl ethyl ketone, methyl isobutyl ketone, and cyclohexanone; alcohols such as methyl alcohol, ethyl alcohol, n-propyl alcohol, isopropyl alcohol, n-butyl alcohol, isobutyl alcohol, s-butyl alcohol, and t-butyl alcohol; and the like. These solvents may be used either alone or in combination.

It is preferable to use water or alcohols, and more preferably water, since the target product can be easily obtained.

The solvent is normally used in an amount of 1 to 1,000 ml, preferably 10 to 500 ml, and more preferably 50 to 200 ml, based on 1 mol of the silane compound (1).

The reaction temperature and the reaction time employed when subjecting the silane compound (1) to polycondensation (reaction) are appropriately selected taking account of the type and the amount of the silane compound (1), the type and the amount of the polycondensation catalyst, the type and the amount of the solvent, and the like.

The reaction temperature is normally within the range from 0° C. to the boiling point of the solvent, and preferably within the range from 20 to 100° C. If the reaction temperature is too low, condensation may not proceed sufficiently. If the reaction temperature is too high, it may be difficult to suppress gelation.

The reaction time is normally within the range from several minutes to 10 hours.

It is preferable to effect the reaction at a reaction temperature of 5 to 35° C. for several minutes to several hours, and then effect the reaction at a reaction temperature of 35 to 100° C. for several tens of minutes to several hours.

It is preferable that the method for producing a curable polysilsesquioxane compound according to one embodiment of the invention further include a step (II) described below when the step (I) (polymerization reaction) is effected in the presence of the acid catalyst.

It is possible to easily obtain the curable polysilsesquioxane compound according to one embodiment of the invention that has the desired $^{29}$Si-NMR spectrum pattern by providing the step (II) that adds an organic solvent to the reaction mixture obtained by the step (I) that uses the acid catalyst to dissolve the polycondensate, and then effects polycondensation (as described below).

Step (II)

In the step (II), an organic solvent is added to the reaction mixture obtained by the step (I) to dissolve the polycondensate of the compound represented by the formula (1) to obtain a solution, a base is added to the solution in a molar equivalent equal to or larger than that of the acid catalyst, and polycondensation is then effected.

The organic solvent used in the step (II) is not particularly limited as long as the organic solvent can dissolve the polycondensate produced by the step (I). It is preferable to use a water-immiscible organic solvent having a boiling point of about 60° C. to about 100° C. from the viewpoint of ease of post-treatment. The term "water-immiscible organic solvent" used herein refers to an organic solvent that has a solubility in water at 25° C. of 10 g/L or less, and is normally separated from water.

Examples of such an organic solvent include aromatic compounds such as benzene; esters such as ethyl acetate and propyl acetate; ketones such as methyl isobutyl ketone; aliphatic hydrocarbons such as heptane and cyclohexane; ethers such as tetrahydrofuran; and the like.

The organic solvent may be used in an arbitrary amount (ratio) as long as the polycondensate can be dissolved in the organic solvent. The organic solvent is normally used in a ratio of 0.5 to 5 parts by mass, and preferably 1 to 3 parts by mass, based on 1 part by mass of the silane compound (1).

It is preferable to use ammonia or an organic base (e.g., pyridine and triethylamine) as the base since the target product can be easily obtained. It is more preferable to use ammonia as the base from the viewpoint of ease of handling. Ammonia may be used in a gaseous state, or may be used in the form of aqueous ammonia.

The base is normally used in a ratio of 1.2 to 5 equivalents, and preferably 1.5 to 2.5 equivalents, based on the acid catalyst used in the step (I).

After the addition of the base, polycondensation is normally effected at 50 to 100° C. for 30 minutes to 10 hours. Note that the reaction time may be adjusted depending on the reaction scale and the like.

It is possible to obtain the curable polysilsesquioxane compound according to one embodiment of the invention that has a high molecular weight and substantially does not have a peak within the range of −53 ppm or more and less than −45 ppm, by effecting polycondensation in the step (II) in addition to polycondensation that is effected in the step (I).

After completion of the reaction, a post-treatment operation that is normally employed when implementing organic synthesis is performed. For example, the reaction mixture is washed with purified water, and the organic layer is concentrated and dried to obtain the target curable polysilsesquioxane compound.

A curable polysilsesquioxane compound having the desired $^{29}$Si-NMR spectrum pattern can be obtained by appropriately setting the reaction conditions as described above taking account of the type of the silane compound (1), the type of the catalyst, and the like.

It is considered that the curable polysilsesquioxane compound according to one embodiment of the invention is represented by the following formula (a-1) when the curable polysilsesquioxane compound is produced using a compound represented by $R^aSi(OR^b)_3$ as the silane compound (1).

$$(R^aSiO_{3/2})_m[R^aSi(OR^b)O_{2/2}]_o[R^aSi(OR^b)_2O_{1/2}]_q \qquad (a-1)$$

wherein $R^a$ is one type of $R^1$, $R^b$ is one type of $R^2$, q is substantially 0, and m and o are independently a positive integer.

It is considered that the curable polysilsesquioxane compound according to one embodiment of the invention is represented by the following formula (a-2) when the curable polysilsesquioxane compound is produced using a compound represented by $R^aSi(OR^b)_3$ and a compound represented by $R^cSi(OR^d)_3$ as the silane compound (1).

$$(R^aSiO_{3/2})_m(R^cSiO_{3/2})_n(R^aSi(OR^b)O_{2/2})_o[R^cSi(OR^d)O_{2/2}]_p[R^aSi(OR^b)_2O_{1/2}]_q[R^cSi(OR^d)_2O_{1/2}]_r \qquad (a-2)$$

wherein $R^a$ and $R^c$ are one type of $R^1$, $R^b$ and $R^d$ are one type of $R^2$, q and r are substantially 0, and m to p are independently a positive integer.

3) Curable Composition

The curable composition according to one embodiment of the invention includes the curable polysilsesquioxane compound according to one embodiment of the invention, and a silane coupling agent. It is preferable that the curable composition according to one embodiment of the invention include the curable polysilsesquioxane compound according to one embodiment of the invention in a ratio of 60 to 99.7 mass %, more preferably 70 to 95 mass %, and still more preferably 80 to 90 mass %.

When the curable composition includes the curable polysilsesquioxane compound according to one embodiment of the invention in a ratio within the above range, and also includes the silane coupling agent, the curable composition can produce a cured product that exhibits high adhesion, excellent heat resistance, and excellent delamination resistance, and rarely produces cracks.

The silane coupling agent is not particularly limited. Examples of the silane coupling agent include a silane compound that includes a vinyl group, such as vinyltrimethoxysilane, vinyltriethoxysilane, vinyltrichlorosilane, p-styryltrimethoxysilane, and vinyltriacetoxysilane; a silane compound that includes a halogen atom, such as γ-chloropropyltrimethoxysilane, chloromethyltrimethoxysilane, and chloromethylphenethyltrimethoxysilane; a silane compound that includes a (meth)acryloxy group, such as γ-methacryloxypropyltrimethoxysilane, γ-methacryloxypropylmethyldimethoxysilane, and 3-acryloxyprophyltrimethoxysilane; a silane compound that includes a mercapto group, such as γ-mercaptopropyltrimethoxysilane; a silane compound that includes a ureido group, such as 3-ureidopropyltriethoxysilane; a silane compound that includes an isocyanate group, such as 3-isocyanatopropyltriethoxysilane; a silane compound that includes an isocyanurate group, such as 1,3,5-N-tris(3-trimethoxysilylpropyl) isocyanurate and 1,3,5-N-tris(3-triethoxysilylpropyl) isocyanurate;

a silane compound that includes an amino group, such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine, N-phenyl-3-aminopropyltrimethoxysilane, and γ-anilinopropyltrimethoxysilane;

a silane compound that includes an epoxy group, such as 2-(3,4-epoxycyclohexyl)ethyltrimethoxysilane, 2-(3,4-epoxycyclohexyl)ethyltriethoxysilane, 3-glycidoxypropyltrimethoxysilane, 3-glycidoxypropyltriethoxysilane, 3-glycidoxypropylmethyldimethoxysilane, and 3-glycidoxypropylmethyldiethoxysilane;

a silane coupling agent that includes an acid anhydride structure, such as 2-trimethoxysilylethylsuccinic anhydride, 3-trimethoxysilylpropylsuccinic anhydride, and 3-triethoxysilylpropylsuccinic anhydride; bis(triethoxysilylpropyl) tetrasulfide; octadecyldimethyl[3-(trimethoxysilyl)propyl] ammonium chloride; and the like.

These silane coupling agents may be used either alone or in combination.

It is preferable to use a silane compound that includes an isocyanurate group or a silane coupling agent that includes an acid anhydride structure, and more preferably both a silane compound that includes an isocyanurate group and a silane coupling agent that includes an acid anhydride structure, since a cured product that exhibits excellent heat resistance and excellent transparency, and exhibits improved adhesion can be obtained.

When using both a silane compound that includes an isocyanurate group and a silane coupling agent that includes an acid anhydride structure, the silane compound that includes an isocyanurate group and the silane coupling agent that includes an acid anhydride structure are used in a mass ratio of 10:0.5 to 10:10.

The silane coupling agent is preferably used so that the mass ratio of the curable polysilsesquioxane compound according to one embodiment of the invention to the silane coupling agent (curable polysilsesquioxane compound:silane coupling agent) is 100:0.3 to 100:30, and more preferably 100:10 to 100:20.

When the silane coupling agent is used in a ratio within the above range, it is possible to obtain a curable composition that can produce a cured product that exhibits improved transparency, improved adhesion, and excellent heat resistance, and rarely shows deterioration in adhesion even when subjected to a high temperature.

The curable composition according to one embodiment of the invention may further include an additional component as long as the object of the invention is not impaired. Examples of the additional component include an antioxidant, a UV absorber, a light stabilizer, a diluent, and the like. The additional component is normally used in a ratio of 10 mass % or less based on the curable composition.

The antioxidant is added to the curable composition in order to prevent deterioration due to oxidation during heating. Examples of the antioxidant include a phosphorus-based antioxidant, a phenol-based antioxidant, a sulfur-based antioxidant, and the like.

Examples of the phosphorus-based antioxidant include phosphites, oxaphosphaphenanthrene oxides, and the like.

Examples of the phenol-based antioxidant include monophenols, bisphenols, polyphenols, and the like.

Examples of the sulfur-based antioxidant include dilauryl 3,3'-thiodipropionate, dimyristyl 3,3'-thiodipropionate, distearyl 3,3'-thiodipropionate, and the like.

These antioxidants may be used either alone or in combination. The antioxidant is normally used in a ratio of 10 mass % or less based on the curable composition.

The UV absorber is added to the curable composition in order to improve the light resistance of the resulting cured product.

Examples of the UV absorber include salicylic acids, benzophenones, benzotriazoles, hindered amines, and the like.

These UV absorbers may be used either alone or in combination.

The light stabilizer is added to the curable composition in order to improve the light resistance of the resulting cured product.

Examples of the light stabilizer include hindered amines such as poly[{6-(1,1,3,3-tetramethylbutyl)amino-1,3,5-triazine-2,4-diyl}{(2,2,6,6-tetramethyl-4-piperidine)imino}hexamethylene {(2,2,6,6-tetramethyl-4-piperidine)imino}], and the like.

These light stabilizers may be used either alone or in combination.

The diluent is added to the curable composition in order to adjust the viscosity of the curable composition.

Examples of the diluent include glycerol diglycidyl ether, butanediol diglycidyl ether, neopentyl glycol glycidyl ether, cyclohexanedimethanol diglycidyl ether, an alkylene diglycidyl ether, polyglycol diglycidyl ether, polypropylene glycol diglycidyl ether, trimethylolpropane triglycidyl ether, glycerol triglycidyl ether, 4-vinylcyclohexene monoxide, vinylcyclohexene dioxide, methylated vinylcyclohexene dioxide, diglycidylaniline, and the like.

These diluents may be used either alone or in combination.

The curable composition according to one embodiment of the invention may be obtained by mixing the curable polysilsesquioxane compound according to one embodiment of the invention, the silane coupling agent, and an optional additional component in a given ratio, and defoaming the mixture using a known method, for example.

The curable composition according to one embodiment of the invention thus obtained can produce a cured product that exhibits high adhesion even when exposed to high-energy light, or subjected to a high temperature.

Therefore, the curable composition according to one embodiment of the invention may suitably be used as a raw material for producing an optical part or a formed article, an adhesive, a coating material, and the like. Since the curable composition according to one embodiment of the invention can prevent deterioration in an optical device-securing material due to an increase in brightness of an optical device, the curable composition according to one embodiment of the invention may suitably be used as an optical device-securing material composition.

4) Cured Product

A cured product according to one embodiment of the invention is obtained by heating the curable composition according to one embodiment of the invention.

The heating temperature is normally 100 to 250° C., and preferably 150 to 200° C., and the heating time is normally 10 minutes to 15 hours, and preferably 30 minutes to 8 hours.

The cured product according to one embodiment of the invention exhibits high adhesion even when exposed to high-energy light, or subjected to a high temperature.

Since the cured product according to one embodiment of the invention can prevent deterioration in an optical device-securing material due to an increase in brightness of an optical device, the cured product according to one embodiment of the invention may suitably be used as an optical device-securing material. For example, the cured product according to one embodiment of the invention may suitably be used as a raw material for producing an optical part or a formed article, an adhesive, a coating material, and the like.

A cured product obtained by curing the curable composition according to one embodiment of the invention exhibits high adhesion when the adhesion is measured as described below, for example.

Specifically, the curable composition is applied to a mirror-finished surface of a silicon chip. The surface of the silicon chip to which the curable composition has been applied is placed on an adherend, and compression-bonded to the adherend, and the curable composition is cured by heating. After allowing the resulting product to stand for 30 seconds on a measurement stage of a bond tester that has been heated to a given temperature (e.g., 23 or 100° C.), adhesion between the specimen and the adherend is measured while applying stress to the bonding surface in the horizontal direction (shear direction) at a height of 50 μm above the adherend.

It is preferable that the cured product have an adhesion at 23° C. of 120 N/2 mm² or more, and have an adhesion at 100° C. of 70 N/2 mm² or more.

A cured product obtained by curing the curable composition according to one embodiment of the invention exhibits excellent delamination resistance when the delamination resistance is measured as described below, for example.

Specifically, the curable composition is applied to an LED lead frame, and a sapphire chip is compression-bonded thereto. After curing the curable composition by heating at 170° C. for 2 hours, a sealing material is poured into the cup, and heated at 150° C. for 1 hour to obtain a cured product specimen. The specimen is allowed to stand at a temperature of 85° C. and a relative humidity of 85% RH for 168 hours, subjected to an IR reflow process (preheating temperature: 160° C., maximum temperature: 260° C., heating time: 1 minute), and subjected to a thermal cycle test (300 cycles, wherein one cycle consists of allowing the specimen to stand at −40° C. for 30 minutes, and allowing the specimen to stand at +100° C. for 30 minutes) using a thermal cycle tester. The sealing material is then removed to determine whether or not the device is removed (delaminated) together with the sealing material. The delamination probability is normally 25% or less when the cured product according to one embodiment of the invention is used.

5) Method for Using as Optical Device-Securing Material

A method for using as an optical device-securing material according to one embodiment of the invention includes using the curable polysilsesquioxane compound according to one embodiment of the invention or the curable composition according to one embodiment of the invention as an optical device-securing material.

Examples of the optical device-securing material include an optical device adhesive, a optical device sealing material, and the like.

Examples of the optical device include a light-emitting device such as an LED and a semiconductor laser (LD), a light-receiving device, a hybrid optical device, an optical integrated circuit, and the like.

Optical Device Adhesive

The curable polysilsesquioxane compound according to one embodiment of the invention or the curable composition according to one embodiment of the invention may suitably be used as an optical device adhesive.

When using the curable polysilsesquioxane compound according to one embodiment of the invention or the curable composition according to one embodiment of the invention as an optical device adhesive, the composition is applied to the bonding target surface of either or both of the adherends (e.g., optical device and substrate), the adherends are compression-bonded, and the composition is cured by heating to firmly bond the adherends, for example.

Examples of a material for forming the substrate to which the optical device is bonded, include glasses such as soda lime glass and heat-resistant hard glass; a ceramic; metals such as iron, copper, aluminum, gold, silver, platinum, chromium, titanium, an alloy thereof, and stainless steel (e.g., SUS302, SUS304, SUS304L, and SUS309); a synthetic resin such as polyethylene terephthalate, polybutylene terephthalate, polyethylene naphthalate, an ethylene-vinyl acetate copolymer, polystyrene, a polycarbonate, polymethylpentene, a polysulfone, polyether ether ketone, polyethersulfone, polyphenylene sulfide, polyetherimide, a polyimide, a polyamide, an acrylic resin, a norbornene resin, a cycloolefin resin, and a glass epoxy resin; and the like.

The heating temperature is determined taking account of the type of the curable polysilsesquioxane compound or the curable composition, and the like, but is normally 100 to 250° C., and preferably 150 to 200° C. The heating time is normally 10 minutes to 15 hours, and preferably 30 minutes to 8 hours.

Optical Device Sealing Material

The curable polysilsesquioxane compound according to one embodiment of the invention or the curable composition according to one embodiment of the invention may suitably be used as an optical device sealing material.

When using the curable polysilsesquioxane compound according to one embodiment of the invention or the curable composition according to one embodiment of the invention as an optical device sealing material, the composition is formed (molded) into the desired shape to obtain a formed article in which an optical device is enclosed, and the formed article is cured by heating to produce a sealed optical device, for example.

The curable polysilsesquioxane compound according to one embodiment of the invention or the curable composition according to one embodiment of the invention may be formed into the desired shape using an arbitrary method. A known molding method such as a transfer molding method or a casting method may be used.

The heating temperature is determined taking account of the type of the curable polysilsesquioxane compound or the curable composition, and the like, but is normally 100 to 250° C., and preferably 150 to 200° C. The heating time is normally 10 minutes to 15 hours, and preferably 30 minutes to 8 hours.

Since the sealed optical device is produced using the curable polysilsesquioxane compound according to one embodiment of the invention or the curable composition according to one embodiment of the invention, the sealed optical device exhibits excellent adhesion.

EXAMPLES

The invention is further described below by way of examples and comparative examples. Note that the invention is not limited to the following examples.

$^{29}$Si-NMR measurement conditions

Device: AV-500 manufactured by Bruker BioSpin K.K.

$^{29}$Si-NMR resonant frequency: 99.352 MHz

Probe: 5 mm (diameter) solution probe

Measurement temperature: room temperature (25° C.)

Sample rotational speed: 20 kHz

Measurement method: inverse gated decoupling method $^{29}$Si flip angle: 90°

$^{29}$Si 90° pulse width: 8.0 μs

Repetition time: 5 s

Integration count: 9,200

Observation width: 30 kHz

Preparation of $^{29}$Si-NMR Sample

Fe(acac)$_3$ was added as a relaxation reagent in order to reduce the relaxation time.

Polysilsesquioxane concentration: 15%

Fe(acac)$_3$ concentration: 0.6%

Measurement solvent: DMSO

Internal standard: TMS

Waveform Analysis

The chemical shift of each peak of the spectrum subjected to a Fourier transform was calculated from the position of the peak top, and integrated.

Example 1

A 300 ml recovery flask was charged with 71.37 g (400 mmol) of methyltriethoxysilane ("KBE-13" manufactured by Shin-Etsu Chemical Co., Ltd.), and an aqueous solution (21.7 g) prepared by dissolving 0.10 g (0.25 mol % based on the total amount of the silane compound) of 35% hydrochloric acid in 21.6 ml of distilled water, was added to the flask with stirring. The mixture was stirred at 30° C. for 2 hours, and then stirred at 70° C. for 5 hours. After the addition of 140 g of propyl acetate, 0.12 g (0.5 mol % based on the total amount of the silane compound) of 28% aqueous ammonia was added to the mixture with stirring, and the resulting mixture was stirred at 70° C. for 3 hours. Purified water was added to the reaction mixture to effect separation, and the organic layer was collected. The organic layer was washed with purified water until the aqueous layer had a pH of 7, and concentrated using an evaporator. The resulting concentrate was dried under vacuum to obtain 55.7 g of a curable polysilsesquioxane compound (A1). The curable polysilsesquioxane compound (A1) had a mass average molecular weight (Mw) of 7,800 and a molecular weight distribution (PDI) of 4.52.

The curable polysilsesquioxane compound (A1) was subjected to $^{29}$Si-NMR spectrum measurement. Table 1 shows the ratio of the integral values of the peaks T1, T2, and T3.

Figure 1:
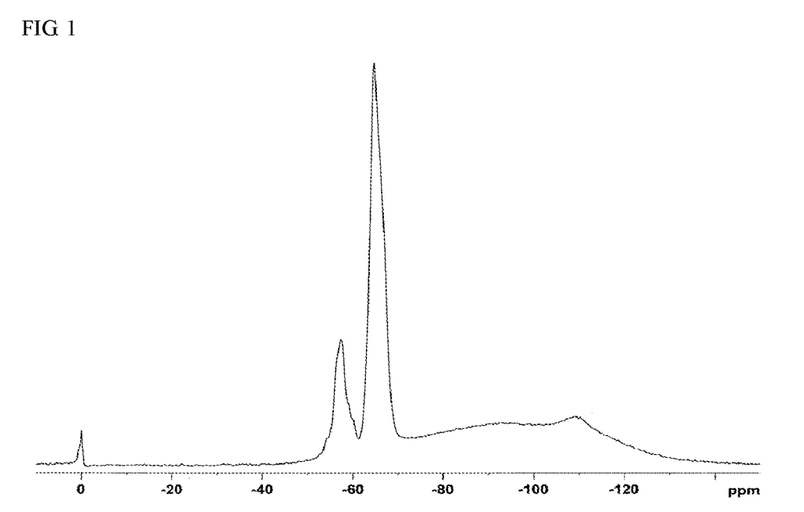
FIG. 1 is the $^{29}$Si-NMR spectrum chart of the curable polysilsesquioxane compound of Example 1.

FIG. 1 illustrates the $^{29}$Si-NMR spectrum chart. In FIG. 1, the horizontal axis indicates the chemical shift (ppm), and the vertical axis indicates the peak intensity.

Example 2

A 300 ml recovery flask was charged with 71.37 g (400 mmol) of methyltriethoxysilane ("KBE-13" manufactured by Shin-Etsu Chemical Co., Ltd.), and an aqueous solution (21.7 g) prepared by dissolving 0.10 g (0.25 mol % based on the total amount of the silane compound) of 35% hydrochloric acid in 21.6 ml of distilled water, was added to the flask with stirring. The mixture was stirred at 30° C. for 2 hours, and then stirred at 70° C. for 5 hours. After the addition of 140 g of propyl acetate, 0.12 g (0.5 mol % based on the total amount of the silane compound) of 28% aqueous ammonia was added to the mixture with stirring, and the resulting mixture was stirred at 70° C. for 5 hours. Next, purified water was added to the reaction mixture to effect separation, and the organic layer was collected. The organic layer was washed with purified water until the aqueous layer had a pH of 7, and concentrated using an evaporator. The resulting concentrate was dried under vacuum to obtain 49.7 g of a curable polysilsesquioxane compound (A2). The curable polysilsesquioxane compound (A2) had an Mw of 30,000 and a PDI of 5.83.

The curable polysilsesquioxane compound (A2) was subjected to $^{29}$Si-NMR spectrum measurement. Table 1 shows the ratio of the integral values of the peaks T1, T2, and T3.

Comparative Example 1

40.2 g of a curable polysilsesquioxane compound (A3) was obtained in the same manner as in Example 1, except that 28% aqueous ammonia was not added. The curable polysilsesquioxane compound (A3) had an Mw of 2,280 and a PDI of 2.1.

The curable polysilsesquioxane compound (A3) was subjected to $^{29}$Si-NMR spectrum measurement. Table 1 shows the ratio of the integral values of the peaks T1, T2, and T3.

Figure 2:
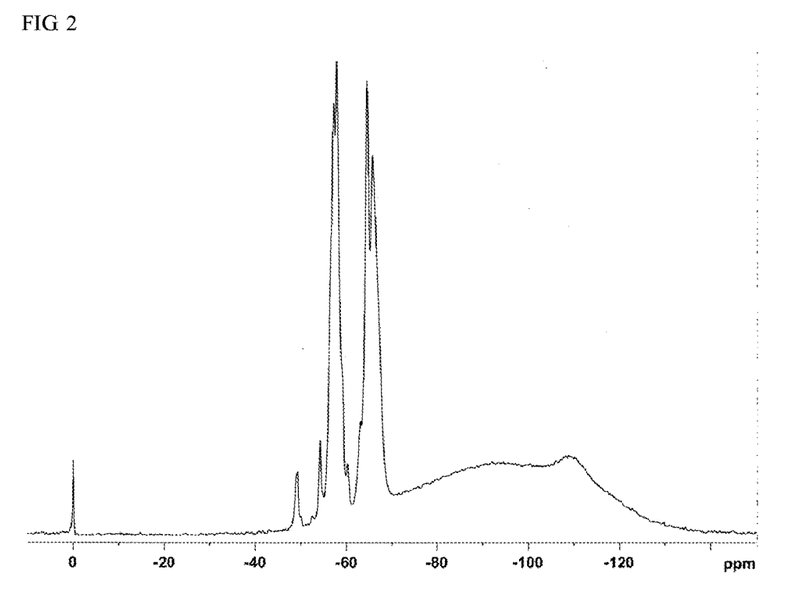
FIG. 2 is the $^{29}$Si-NMR spectrum chart of the curable polysilsesquioxane compound of Comparative Example 1.

FIG. 2 illustrates the $^{29}$Si-NMR spectrum chart. In FIG. 2, the horizontal axis indicates the chemical shift (ppm), and the vertical axis indicates the peak intensity.

Example 3

10 parts (parts by mass (hereinafter the same)) of 1,3,5-N-tris[3-(trimethoxysilyl)propyl] isocyanurate ("(B1)" in Table 1) (silane coupling agent) and 1 part of 3-trimethoxysilylpropylsuccinic anhydride ("(B2)" in Table 1) (silane coupling agent) were added to 100 parts of the curable polysilsesquioxane compound (A1) obtained in Example 1. After the addition of diethylene glycol monoethyl acetate to adjust the solid content to 80%, the mixture was sufficiently mixed and defoamed to obtain a curable composition 1 of Example 3.

Examples 4 to 8 and Comparative Examples 2 to 4

Curable compositions 2 and 6 and 1r to 3r were obtained in the same manner as in Example 3, except that the type of the curable polysilsesquioxane compound and the amount (parts) of the silane coupling agent were changed as shown in Table 1.

Cured products of the curable compositions 1 to 6 obtained in Examples 3 to 8 and the curable compositions 1r to 3r obtained in Comparative Examples 2 to 4 were subjected to the following adhesion test, crack resistance test, and delamination resistance test, and the crack rate and the delamination rate were calculated.

Adhesion Test

The curable composition (curable compositions 1 to 6 and 1r to 3r) was applied to the mirror-finished surface of a silicon chip (2×2 mm) to a thickness of about 2 μm. The surface of the silicon chip to which the curable composition had been applied was placed on an adherend (silver-plated copper sheet), and compression-bonded to the adherend. The curable composition was cured by heating at 170° C. for 2 hours to prepare a specimen-bonded adherend. After allowing the specimen-bonded adherend to stand for 30 seconds on a measurement stage of a bond tester ("Series 4000" manufactured by Dage Co., Ltd.) that had been heated to a given temperature (23° C. or 100° C.), adhesion (N/mm$^2$) (at 23° C. and 100° C.) between the specimen and the adherend was measured while applying stress (speed: 200 μm/s) to the bonding surface in the horizontal direction (shear direction) at a height of 50 μm above the adherend. The measurement results are shown in Table 1.

Crack Resistance Test

The curable composition (curable compositions 1 to 6 and 1r to 3r) was diluted with diethylene glycol monobutyl ether acetate to adjust the solid content to 80 mass %. The curable composition was applied to the mirror-finished surface of a silicon chip (2×2 mm) to a thickness of about 2 μm. The surface of the silicon chip to which the curable composition had been applied was placed on an adherend (silver-plated copper sheet), and compression-bonded to the adherend. The curable composition was cured by heating at 170° C. for 2 hours to prepare a specimen-bonded adherend. The width of a resin (fillet) protruding from the silicon chip was measured using a digital microscope ("VHX-1000" manufactured by Keyence Corporation). Fifteen specimen-bonded adherends in which a fillet had a width of 80 to 120 nm and was formed along each side of the silicon chip were selected as evaluation samples.

The fillet of each evaluation sample was observed using an electron microscope (manufactured by Keyence Corporation) to determine the number of samples in which cracks had occurred. A case where the crack rate was 0% or more and less than 25% was evaluated as "A", a case where the crack rate was 25% or more and less than 50% was evaluated as "B", and a case where the crack rate was 50 to 100% was evaluated as "C".

Delamination Resistance Test

The curable composition (curable compositions 1 to 6 and 1r to 3r) was applied to an LED lead frame ("5050 D/G PKG LEAD FRAME" manufactured by Enomoto Co., Ltd.) to a diameter of about 0.4 mm, and a sapphire chip (0.5×0.5 mm) was compression-bonded thereto. After curing the curable composition by heating at 170° C. for 2 hours, a sealing material ("EG6301" manufactured by Shin-Etsu Chemical Co., Ltd.) was poured into the cup, and heated at 150° C. for 1 hour to obtain a specimen.

The specimen was allowed to stand at a temperature of 85° C. and a relative humidity of 85% RH for 168 hours, and subjected to an IR reflow process (preheating temperature: 160° C., maximum temperature: 260° C., heating time: 1 minute) (reflow oven: "WL-15-20DNX" manufactured by Sagami-Rikou Co. Ltd.). The specimen was then subjected to a thermal cycle test (300 cycles, wherein one cycle consists of allowing the specimen to stand at −40° C. for 30 minutes, and allowing the specimen to stand at +100° C. for 30 minutes) using a thermal cycle tester. The sealing material was then removed to determine whether or not the device was removed (delaminated) together with the sealing material. Each curable composition was subjected to this test 12 times.

The number of times in which the device was removed (delaminated) together with the sealing material was counted. A case where the delamination rate was 25% or less was evaluated as "A", a case where the delamination rate was more than 25% and 50% or less was evaluated as "B", and a case where the delamination rate was more than 50% was evaluated as "C".

TABLE 1

| | Curable compound | Silane coupling agent | | | | | | |
|---|---|---|---|---|---|---|---|---|
| | (100 parts) | (B1) | (B2) | T1 | T2 | T3 | Mw | PDI |
| Example 3 | (A1) | 10 | 1 | 0 | 24.29 | 75.71 | 7,800 | 4.52 |
| Example 4 | | | 3 | | | | | |
| Example 5 | | | 5 | | | | | |
| Example 6 | (A2) | 10 | 1 | 0 | 25.38 | 74.62 | 30,000 | 5.83 |
| Example 7 | | | 3 | | | | | |
| Example 8 | | | 5 | | | | | |
| Comparative Example 2 | (A3) | 10 | 1 | 2.83 | 44.53 | 52.63 | 2,280 | 2.1 |
| Comparative Example 3 | | | 3 | | | | | |
| Comparative Example 4 | | | 5 | | | | | |

| | Curable composition | Adhesion | | Crack resistance test | Delamination resistance test |
|---|---|---|---|---|---|
| | | 23° C. | 100° C. | | |
| Example 3 | 1 | 148.08 | 89.04 | A | A |
| Example 4 | 2 | 141.51 | 106.27 | A | A |
| Example 5 | 3 | 140.94 | 112.69 | A | A |
| Example 6 | 4 | 132.47 | 79.15 | A | A |
| Example 7 | 5 | 140.33 | 100.34 | A | A |
| Example 8 | 6 | 142.11 | 109.61 | A | A |
| Comparative Example 2 | 1r | 125.47 | 83.54 | C | B |
| Comparative Example 3 | 2r | 132.64 | 103.67 | C | A |
| Comparative Example 4 | 3r | 133.75 | 110.44 | C | A |

As shown in Table 1, the cured products of the curable compositions 1 to 6 obtained using the curable polysilsesquioxane compound (A1) or (A2) of Example 1 or 2 had an adhesion at 23° C. of 130 N/2 mm² or more (i.e., exhibited excellent adhesion). The cured products had an adhesion at 100° C. of 79 N/2 mm² or more (i.e., exhibited excellent heat resistance). No cracks were observed when the cured products were subjected to the crack resistance test (i.e., the evaluation result was "A"). The evaluation result was also "A" when the cured products were subjected to the delamination resistance test (i.e., the cured products exhibited excellent delamination resistance).

On the other hand, the cured products of the curable compositions 1r to 3r of Comparative Examples 2 to 4 obtained using the curable polysilsesquioxane compound (A3) had a high crack rate.

The invention claimed is:

1. A method for producing a curable polysilsesquioxane compound comprising one structural unit or two or more structural units represented by $R^1SiO_{3/2}$, the curable polysilsesquioxane compound having a $^{29}Si$ nuclear magnetic resonance spectrum that
has a first peak top within a range of −60 ppm or more and less than −54 ppm, and has a second peak top within a range of −70 ppm or more and less than −61 ppm, and a peak is not observed within the range of −53 ppm or more and less than −45 ppm, or, the ratio of the integral value of the peak within the range of −53 ppm or more and less than −45 ppm to the integral value of the peak within the range of −60 ppm or more and less than −54 ppm is less than 0.5% in the $^{29}$Si nuclear magnetic resonance spectrum, the method comprising a step (I) that subjects one compound or two or more compounds represented by a formula (1) to polycondensation in the presence of an acid catalyst, and R$^1$Si(OR$^2$)$_3$  (1)

a step (II) that adds an organic solvent to a reaction mixture obtained by the step (I) to dissolve a polycondensate of the compound represented by the formula (1) to obtain a solution, adds a base to the solution in a molar equivalent equal to or larger than that of the acid catalyst, and then effects polycondensation, wherein R$^1$ is an alkyl group having 1 to 10 carbon atoms, and R$^2$ is a hydrogen atom or an alkyl group having 1 to 10 carbon atoms, provided that a plurality of R$^2$ are either identical to or different from each other.

2. A method for using a curable polysilsesquioxane compound as an optical device-securing adhesive, said curable polysilsesquioxane compound comprising one structural unit or two or more structural units represented by R$^1$SiO$_{3/2}$ wherein R$^1$ is an alkyl group having 1 to 10 carbon atoms, the curable polysilsesquioxane compound having a $^{29}$Si nuclear magnetic resonance spectrum that has a first peak top within a range of −60 ppm or more and less than −54 ppm, and has a second peak top within a range of −70 ppm or more and less than −61 ppm, and a peak is not observed within the range of −53 ppm or more and less than −45 ppm, or, the ratio of the integral value of the peak within the range of −53 ppm or more and less than −45 ppm to the integral value of the peak within the range of −60 ppm or more and less than −54 ppm is less than 0.5% in the $^{29}$Si nuclear magnetic resonance spectrum, said method comprising applying the curable polysilsesquioxane compound to a bonding surface of an optical device.

3. A method for using a curable composition as an optical device-securing adhesive, wherein the curable composition comprises a curable polysilsesquioxane compound and a silane coupling agent, the curable polysilsesquioxane compound comprising one structural unit or two or more structural units represented by R$^1$SiO$_{3/2}$, wherein R$^1$ is an alkyl group having 1 to 10 carbon atoms, the curable polysilsesquioxane compound having a $^{29}$Si nuclear magnetic resonance spectrum that has a first peak top within a range of −60 ppm or more and less than −54 ppm, and has a second peak top within a range of −70 ppm or more and less than −61 ppm, and a peak is not observed within the range of −53 ppm or more and less than −45 ppm, or, the ratio of the integral value of the peak within the range of −53 ppm or more and less than −45 ppm to the integral value of the peak within the range of −60 ppm or more and less than −54 ppm is less than 0.5% in the $^{29}$Si nuclear magnetic resonance spectrum, said method comprising applying the curable composition to a bonding surface of an optical device.

4. The method for producing a curable polysilsesquioxane compound according to claim 1, wherein the curable polysilsesquioxane compound has the $^{29}$Si nuclear magnetic resonance spectrum in which a ratio of an integral value (P2) of a peak within the range of −70 ppm or more and less than −61 ppm to the sum of an integral value (P1) of a peak within the range of −60 ppm or more and less than −54 ppm and the integral value (P2) is 60 to 90%.

5. The method for producing a curable polysilsesquioxane compound according to claim 1, wherein the curable polysilsesquioxane compound is a compound having a mass average molecular weight of 1,000 to 50,000.

6. The method for producing a curable polysilsesquioxane compound according to claim 1, wherein the acid catalyst is at least one acid catalyst selected from a group consisting of hydrochloric acid, boric acid, citric acid, acetic acid, sulfuric acid, and methanesulfonic acid.

7. The method according to claim 2, wherein the curable polysilsesquioxane compound has the $^{29}$Si nuclear magnetic resonance spectrum in which a ratio of an integral value (P2) of a peak within the range of −70 ppm or more and less than −61 ppm to the sum of an integral value (P1) of a peak within the range of −60 ppm or more and less than −54 ppm and the integral value (P2) is 60 to 90%.

8. The method according to claim 2, wherein the material for forming the substrate to which the optical device is bonded includes glasses, ceramics, metals or synthetic resins.

9. The method for producing to claim 3, wherein the curable polysilsesquioxane compound has the $^{29}$Si nuclear magnetic resonance spectrum in which a ratio of an integral value (P2) of a peak within the range of −70 ppm or more and less than −61 ppm to the sum of an integral value (P1) of a peak within the range of −60 ppm or more and less than −54 ppm and the integral value (P2) is 60 to 90%.

10. The method according to claim 3, wherein the material for forming the substrate to which the optical device is bonded includes glasses, ceramics, metals or synthetic resins.

11. A method for using a curable polysilsesquioxane compound as an optical device-securing sealing material, wherein the curable polysilsesquioxane compound comprises one structural unit or two or more structural units represented by R$^1$SiO$_{3/2}$, wherein R$^1$ is an alkyl group having 1 to 10 carbon atoms, the curable polysilsesquioxane compound having a $^{29}$Si nuclear magnetic resonance spectrum that has a first peak top within a range of −60 ppm or more and less than −54 ppm, and has a second peak top within a range of −70 ppm or more and less than −61 ppm, and a peak is not observed within the range of −53 ppm or more and less than −45 ppm, or, the ratio of the integral value of the peak within the range of −53 ppm or more and less than −45 ppm to the integral value of the peak within the range of −60 ppm or more and less than −54 ppm is less than 0.5% in the $^{29}$Si nuclear magnetic resonance spectrum, said method comprising forming the curable polysilsesquioxane compound into the desired shape to obtain a forming article in which an optical device is enclosed, and the formed article being cured by heating to produce a sealed optical device.

12. The method according to claim 11, wherein the curable polysilsesquioxane compound has the $^{29}$Si nuclear magnetic resonance spectrum in which a ratio of an integral value (P2) of a peak within the range of −70 ppm or more and less than −61 ppm to the sum of an integral value (P1) of a peak within the range of −60 ppm or more and less than −54 ppm and the integral value (P2) is 60 to 90%.

13. A method for using a curable composition as an optical device-securing sealing material,
wherein the curable composition comprises a curable polysilsesquioxane compound and a silane coupling agent,
the polysilsesquioxane compound comprising one structural unit or two or more structural units represented by $R^1SiO_{3/2}$,
wherein $R^1$ is an alkyl group having 1 to 10 carbon atoms, the curable polysilsesquioxane compound having a $^{29}$Si nuclear magnetic resonance spectrum that has a first peak top within a range of −60 ppm or more and less than −54 ppm, and has a second peak top within a range of −70 ppm or more and less than −61 ppm, and
substantially does not have a peak within the range of −53 ppm or more and less than −45 ppm, or, the ratio of the integral value of the peak within the range of −53 ppm or more and less than −45 ppm to the integral value of the peak within the range of −60 ppm or more and less than −54 ppm is less than 0.5% in the $^{29}$Si nuclear magnetic resonance spectrum,
said method comprising forming the curable composition into the desired shape to obtain a formed article in which an optical device is enclosed, and the formed article being cured by heating to produce a sealed optical device.

14. The method according to claim 13,
wherein the curable polysilsesquioxane compound has the $^{29}$Si nuclear magnetic resonance spectrum in which a ratio of an integral value (P2) of a peak within the range of −70 ppm or more and less than −61 ppm to the sum of an integral value (P1) of a peak within the range of −60 ppm or more and less than −54 ppm and the integral value (P2) is 60 to 90%.

\* \* \* \* \*